United States Patent
Walden

[19]

[11] Patent Number: 6,166,592
[45] Date of Patent: Dec. 26, 2000

[54] LINEAR CMOS TRANSCONDUCTOR WITH RAIL-TO-RAIL COMPLIANCE

[75] Inventor: Robert William Walden, Bethlehem, Pa.

[73] Assignee: Lucent Technologies Inc., Murray Hill, N.J.

[21] Appl. No.: 09/206,030

[22] Filed: Dec. 4, 1998

Related U.S. Application Data

[63] Continuation-in-part of application No. 09/127,702, Jul. 31, 1998.

[51] Int. Cl.$^7$ ........................................................ G06G 7/12
[52] U.S. Cl. ............................ 327/562; 327/563; 327/103
[58] Field of Search ................................ 327/560, 561, 327/562, 563, 103, 352, 361, 310, 295

[56] References Cited

U.S. PATENT DOCUMENTS

| | | | |
|---|---|---|---|
| 4,555,673 | 11/1985 | Huijsing et al. | 330/258 |
| 5,315,264 | 5/1994 | Sundby et al. | 330/253 |
| 5,361,040 | 11/1994 | Barrett, Jr. | 330/253 |
| 5,561,392 | 10/1996 | Kimura | 327/350 |
| 5,812,014 | 9/1998 | Mazzucco et al. | 327/531 |
| 5,825,228 | 10/1998 | Gross | 327/333 |
| 5,907,259 | 5/1999 | Yamada et al. | 327/563 |
| 5,910,745 | 6/1999 | Zarabadi | 327/356 |

*Primary Examiner*—Timothy P. Callahan
*Assistant Examiner*—Hai L. Nguyen
*Attorney, Agent, or Firm*—Brown Raysman Millstein Felder & Steiner LLP

[57] ABSTRACT

An integrated transconductor circuit has an active load element and two parallel sets of transconductor stages. The active load element provides a high impedance without requiring a large area within the integrated transconductor circuit, and provides linear impedance when the active load devices are biased in the triode region of their respective characteristic curves. The multiple transconductor stages prevent saturation from reducing the dynamic range available at the output of the transconductor circuit. The parallel sets of transconductor stages are used to improve output linearity by reducing the differences between the threshold voltages of the serially-connected transconductor stages. In a particular example, the sizes of the active devices of the sets of transconductor circuit stages are chosen to provide a monotonic, substantially exponential transconductance to implement a control input to a current-controlled oscillator in a phase-locked loop that assures the frequency-independent stability of the phase-locked loop. The exponential function is selectively rolled off at the upper end to prevent excessively high-frequency operation at start-up from over-driving a divider logic and locking up the phase-locked loop. The transfer function curve of the transconductor circuit is robust to process variations over a wide range of operating conditions.

23 Claims, 8 Drawing Sheets

LINEAR CMOS TRANSDUCTOR WITH RAIL-TO-RAIL COMPLIANCE

CROSS-REFERENCE TO RELATED APPLICATIONS

This disclosure is a continuation-in-part of U.S. application Ser. No. 09/127,702, filed Jul. 31, 1998.

BACKGROUND OF THE INVENTION

1. Field of the Invention

The present invention pertains to high performance integrated analog circuits. More particularly, the present invention is directed to transconductor circuits having single-ended inputs.

2. Discussion of Related Art

Many personal communications devices, such as pagers as well as cellular voice and data terminal devices, are already available in pocket-size models. The construction of such devices is rapidly approaching "wallet-size" dimensions, which requires micro-miniaturization of both the circuits and the power cells used by such devices. Such micro-miniaturized circuits include high-performance analog audio and radio frequency (RF) circuit elements which must operate on the low power levels available from corresponding miniature power cells, and must operate within an operating range which may be only two volts relative to ground, at most. In particular, the audio circuits must provide linear response to voice signals without losing the dynamic range required for reproducing expressive speech.

Linear integrated field-effect-transistor (FET)-based transconductor circuits for small-signal differential inputs are known, such as the circuits disclosed in U.S. Pat. No. 5,568,091 to Ramalho et al. and U.S. Pat. No. 5,751,177 to Tanoi. Some known circuits provide substantially rail-to-rail compliance with the input signal at their output terminals, such as described in the Ramalho U.S. Pat. No. 5,568,091 patent. On the other hand, single-ended transconductor circuits, such as circuits similar to the generic transconductor circuit 5 shown in FIG. 1, are not as easily implemented. In particular, although some differential transconductor circuits provide for low-power operation by eliminating transconductance elements from the tails of a differential amplifier pair used by the transconductor circuits, single-ended circuits require a large value for the resistance $R_L$ in order to minimize power consumption according to:

$$I_{OUT} = (V_{IN} - V_t)/R_L.$$

In an example implementation, the load resistor 14, such as a polysilicon or N-tub resistor, has a load resistance $R_L$ of about 1 MΩ connected to the input amplifier 12 in FIG. 1. Implementing a load resistor 14 with such a high resistance value typically requires a large amount of "real estate" on the surface of a integrated circuit implementing the transconductor circuit 5. Such an integrated circuit would be awkwardly large and, more important, too costly to be practical for implementing low-power transconductor circuits 5 in pocket and wallet-size models of the personal communications devices. Furthermore, although metal oxide semiconductor FET (MOSFET)-based integrated circuits are well suited to miniature, low-power implementations of circuits for personal communications devices, such MOSFET integrated circuits have threshold offsets that severely reduce their dynamic operating range, and such circuits operate with non-linear characteristics for much of the operating range between that threshold offset and saturation.

SUMMARY OF THE INVENTION

In accordance with the present invention, a single-ended rail-to-rail input voltage is translated to an output current that is fully compliant with a rail-to-rail voltage input and independent of output voltage, thereby preserving the full dynamic range of the input signal. The invention provides a compact, reliable and readily replicable transconductor element having a highly accurate, selectable transfer function.

In a first preferred embodiment, multiple transconductor stages are provided in the transconductor circuit. In such multiple stages, a pre-amplifier element amplifies an input voltage $V_{IN}$ so that the input provided to the input amplifier element of the first stage is $V_{IN}+V_t$, where $V_t$ is the threshold voltage of the input amplifier element in the first stage. The input to the input amplifier element in each successive stage is connected between the input amplifier element and load element in the preceding stage, and the output currents of the stages are added to provide an output current $I_{SUM}$ for the multistage transconductor circuit.

In a second preferred embodiment, the output current of the transconductor circuit is the sum of the output currents of first and second parallel sets of transconductor stages. In the parallel sets of multiple stages, a pre-amplifier element amplifies the input voltage $V_{IN}$ so that the input voltage provided to the input amplifier element in the first stage in each set of stages is $V_{IN}+V_t$ where $V_t$ is the threshold voltage of that first input amplifier element. The output currents of the two sets of stages are added to provide an output current $I_{SUM}$ for the multistage transconductor circuit.

The transconductor circuit includes a plurality of transconductor stages, each transconductor stage having an amplifier element for amplifying a respective stage input signal to generate a respective stage output signal of the transconductor stage, and an active load element connected to the respective amplifier element for generating the respective stage output signal with substantially linear resistance characteristics. A first transconductor stage receives a circuit input signal input to the transconductor circuit as the respective stage input signal thereof, and the first transconductor stage operates as a pre-amplifier to a successive transconductor stage, and with the stage output signal of a final transconductor stage being the output signal of the transconductor circuit. Preferably, the output current $I_{SUM}$ of the transconductor circuit is supplied to an output stage including a current mirror circuit.

BRIEF DESCRIPTION OF THE DRAWINGS

The features and advantages of the present invention are understood when the preferred embodiments described below are considered in conjunction with the accompanying drawings, wherein like reference numerals refer to like elements, in which:

FIG. 2c shows a supplementary current mirror for providing a complementary current output for the circuit in FIG. 2a;

FIG. 2d shows individual transfer functions of the stages of the circuit shown in FIG. 2a;

FIG. 2e shows cumulative transfer functions of the stages of the circuit shown in FIG. 2a;

FIG. 3b shows individual linear transfer functions of the stages of the circuit shown in FIG. 3a;

FIG. 3c shows cumulative linear transfer functions of the stages of the circuit shown in FIG. 3a;

FIG. 4b shows individual non-linear transfer functions of the stages of the circuit shown in FIG. 3a;

FIG. 4c shows the cumulative non-linear transfer function of the stages of the circuit shown in FIG. 3a.

DETAILED DESCRIPTION OF THE PREFERRED EMBODIMENTS

Figure 2B:
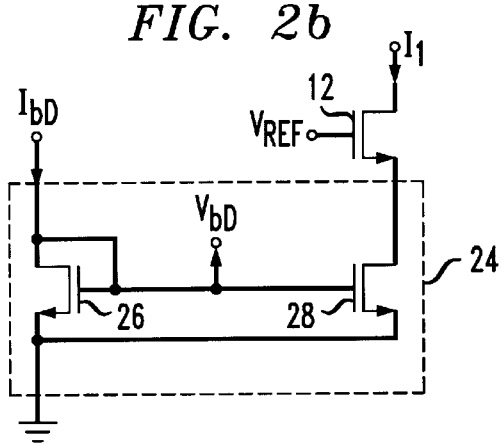
FIG. 2b is a portion of the circuit of FIG. 2a showing a single-ended transconductor stage having an active load.
Figure 2C:
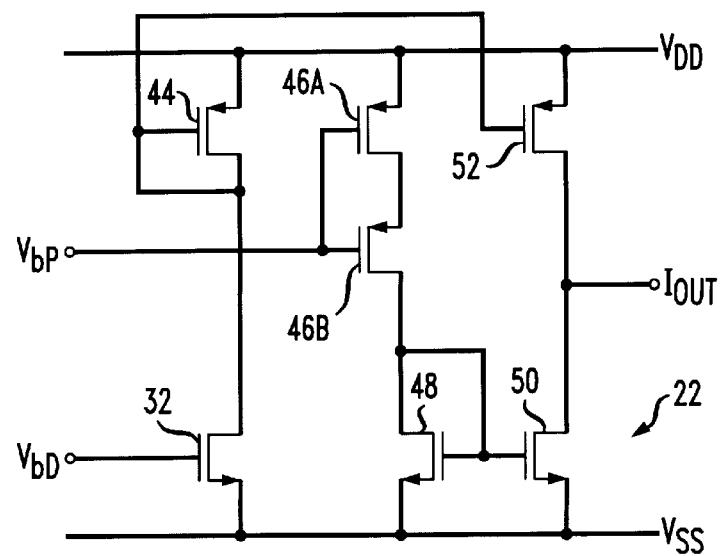
Figure 2A:
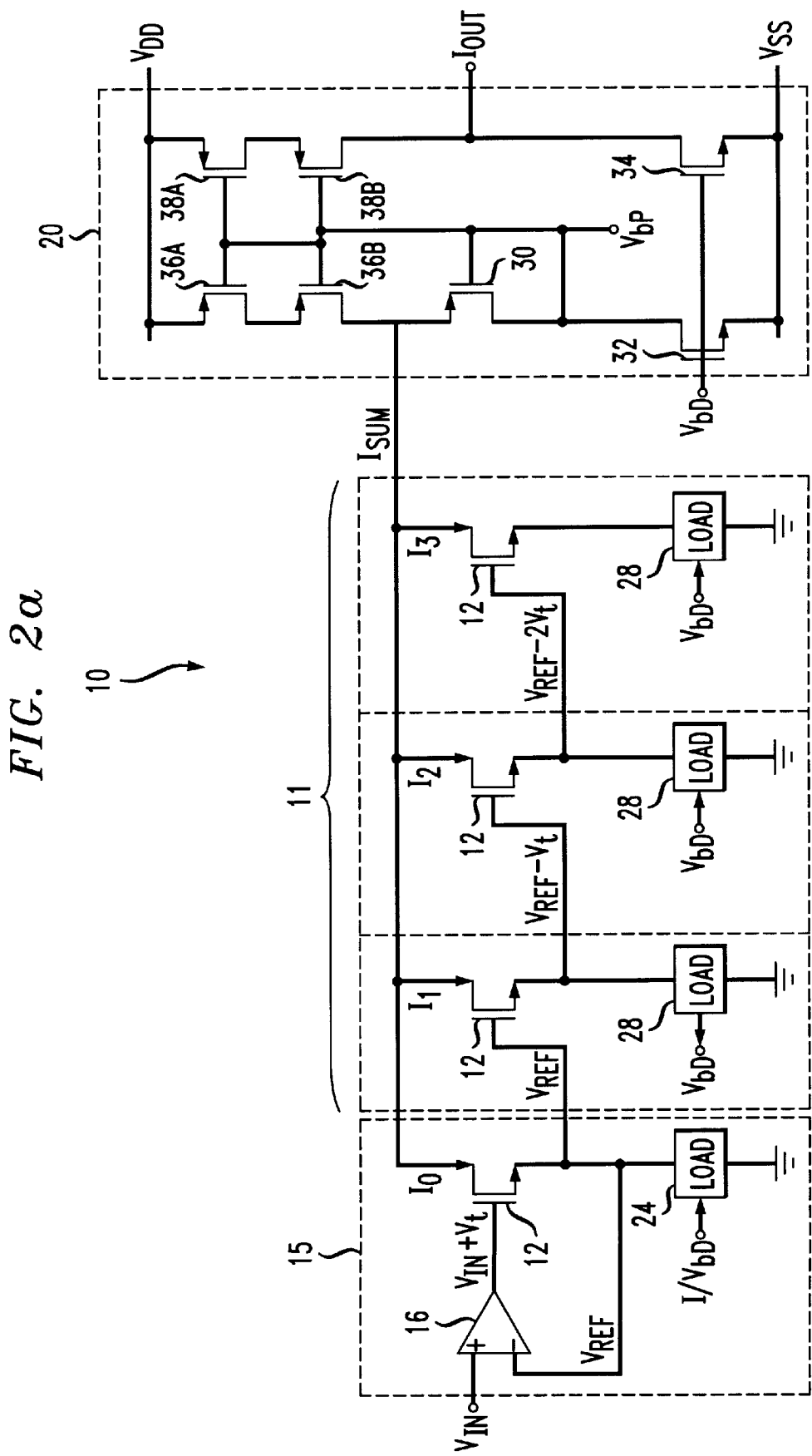
FIG. 2a shows a multistage single-ended transconductor circuit having a current mirror output stage.

With reference to FIG. 2a, a transconductor circuit 10 in accordance with a first preferred embodiment of the invention is shown, with the transconductor circuit 10 providing rail-to-rail compliance, such that input voltage signals $V_{IN}$ varying across the full dynamic range of the circuit 10 between the power supply voltage $V_{DD}$ and the ground potential $V_{SS}$ of the circuit 10 are translated into a rail-to-rail-compliant current output $I_{OUT}$.

The voltage signal $V_{IN}$ input to the transconductor stages 11 is provided through a pre-amplifier stage 15, which includes an operational amplifier 16 with inputs $V_{IN}$ and $V_{REF}$ and an output connected to the gate of the FET amplifier 12. Specifically, the operational amplifier 16 increases the input voltage signal level $V_{IN}$ to $(V_{IN}+V_t)$ so that $V_t$, which is the input voltage threshold for the input FET amplifier 12 in the pre-amplifier stage 15, is eliminated as an offset voltage. The input to each of the input FET amplifiers 12 in each of the transconductor stages 11 is connected between the input FET amplifier 12 and the load of the preceding stage. The output currents $I_0$, $I_1$, $I_2$, and $I_3$ of all preceding stages are added, and the result $I_{SUM}$ is produced as an output current $I_{OUT}$ by a current mirror output stage 20.

The current mirror output stage 20 maintains the full compliance of the output current $I_{SUM}$ while the rail-to-rail input signal $V_{IN}$ is varied at the input to the transconductor circuit 10, while providing current gain in a manner well-known in the art. In particular, additional transistors 30 and 32 in the output stage mirror circuit 20 act as a level shifter, which assures adequate headroom, allowing the current mirror 20 to operate accurately, even when the supply voltage is reduced to less than 2 volts. Transistor 34, on the other hand, compensates for the excess output current introduced by the level shifter formed by the transistors 30, 32, so that $I_{OUT}=0$ when $V_{IN}=0$, approximately. Alternatively, the characteristics of transistor 34 in the mirror circuit 20 can be selected so as to provide an offset current such that the output current $I_{OUT}$ changes direction as the input voltage $V_{IN}$ sweeps from ground to $V_{DD}$. In one embodiment, the output stage mirror circuit 20 includes the transistors 32, 34 with their gates connected to receive the bias voltage $V_{bD}$. The transistors 30, 32, 36A–36B, 38A–3B generate a bias voltage $V_{bP}$ at a common node. The transistors 36A–36B may be in a cascode configuration, as shown in FIG. 2a, or may be implemented by a single transistor device. Similarly, the transistors 38A–38B may be in a cascode configuration, as shown in FIG. 2a, or may be implemented by a single transistor device.

FIG. 2b shows the active load element 24, which includes a simple current mirror having two similarly-constructed transistors 26, 28. The active load element 24 may be used in any of the transconductor stages 11 and/or the pre-amplifier stage 15 shown in FIG. 2a. In the illustrated embodiment shown in FIG. 2a, each of the stages 11, 15 includes a transistor 28 for receiving the bias voltage $V_{bD}$. At least one of the stages 11, 15 also includes a transistor 26, as shown in FIG. 2b, to generate the bias current as the applied bias voltage $V_{bD}$, and so, for example, the pre-amplifier stage 15 as shown in FIG. 2a includes the element 24 having transistors 26, 28 instead of merely a transistor 28 as shown, for example, in the transconductor stages 11 of FIG. 2a. The currents in FIGS. 2d–2e as well as FIGS. 3b–3c and FIGS. 4b–4d are measured in μA; that is, in $10^{-6}$ A or ×1E-6 A.

Figure 1:
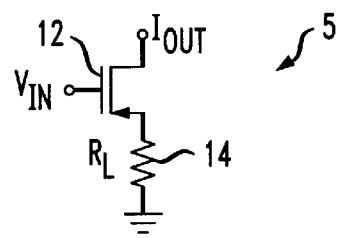
FIG. 1 shows a single-ended transconductor circuit of the prior art.

Referring to FIG. 2b, the FET 26 is connected between a source of bias current $I_{bD}$ and ground. FET 26 is diode-connected to the current source to receive the current $I_{bD}$ in order to generate a corresponding bias voltage $V_{bD}$. The transistor 28 is connected between the source of the input FET amplifier 12 and ground, with the transistor 28 of FIG. 2b, as an active load element, replacing the resistance 14 in FIG. 1. The gates of the transistors 26, 28 are connected to each other and to the source of the bias current $I_{bD}$. The effective resistance across the transistor 28 which controls the output level of the corresponding one of the transconductor stages 11 is then determined by the bias current $I_{bD}$ connected to the diode-connected transistor 26.

The active load 24 can be used to produce a good approximation of the output provided by a physical linear resistive load $R_L$ if the transistors 26, 28 are biased in the triode region of their characteristic curves, so that:

$$I_{DS}=k^1(W/L)[(V_{GS}-V_t)V_{DS}-V^2_{DS}/2],$$

where $V_{DS}>(V_{GS}-V_t)$
where $V_{DS}$ is a drain-source voltage, $V_{GS}$ is the gate-source voltage, W is the channel width, L is the channel length, and $k^1$ is a process constant known in the art. The values for $I_{DS}$ and $V_{DS}$ are measured for drain to source on a given transistor, while $V_{GS}$ is measured from gate to source on the transistor. Further discussion of this quasi-linear regime can be found in standard texts. For example, see P. R. Gray and R. G. Meyer, *Analysis and Design of Analog Integrated Circuits*, Third Edition (Wiley: N.Y.), p. 64 (1993).

In FIG. 2b, if the bias current $I_{bD}$ is about 1.0 μA, the resistance of the active resistance element 24 is about 1 MΩ, with the width W and length L of the active elements 26, 28 selected so that $V_{DS}>>(V_{GS}-V_t)$. Optionally, the output of the current mirror stage 20 is also supplied to a further current mirror stage 22, shown in FIG. 2c, which receives the voltages $V_{bD}$ and $V_{bP}$ from the circuit in FIG. 2a, to provide a complementary output $\overline{I_{OUT}}$ when the transconductor circuit 10 is to supply a differential current output, as is well known in the art. In an illustrative embodiment, the current mirror stage 22 may include the transistor 32 receiving the bias voltage $V_{bD}$ at its gate, and connected to the drain voltage $V_{DD}$ through a transistor 44. The current flowing through the transistors 32, 44 is mirrored by the transistor 52. The bias voltage $V_{bP}$, generated as described above by the circuit in FIG. 2a, biases the at least one transistor 46A, 46B to generate a current through transistor 48, which is mirrored by transistor 50. The at least one transistor 46A, 46B may be in a cascode configuration, or may be implemented as a single transistor device. The current mirror stage 22 of FIG. 2c generates an inverse $\overline{I_{OUT}}$ of the output current $I_{OUT}$ of the circuit of FIG. 2a.

The variations in process and operating conditions normally encountered cause substantial variations in the ratio between $V_{DS}$ and $(V_{GS}-V_t)$. When $V_{DS}$ is too small, there is only a small voltage range over which the resistive element 24 is relatively linear in resistance. When $V_{DS}$ is too close to the positive supply voltage, the amount of bias current $I_{bD}$ needed to maintain full current flow through the transistor elements 28 is prohibitively large for any practical low-power implementation.

For example, in the transconductor circuit 10 shown in FIG. 2a, in the transconductor stage 15 having the current $I_0$, the current $I_0$ increases almost linearly with $V_{IN}$ while $V_{DS}$ for the transistor element 28 is much less than $(V_{bD}-V_t)$. As $V_{DS}$ rises above $(V_{bD}-V_t)$, the active elements 28 saturate. At saturation, $I_{OUT}=I_{IN}$ across both transistors 26, 28 of FIG. 2b implemented in the transconductor stage 15 for all higher values of $V_{REF}$. This process-sensitive linear dynamic range is widened if a series of additional transconductor stages are added, each with a voltage offset from the others, with cumulative input offsets and the outputs added together, as shown in FIG. 2a:

$$I_{SUM}=I_0+I_1+I_2+I_3+\ldots$$

Figure 2D:
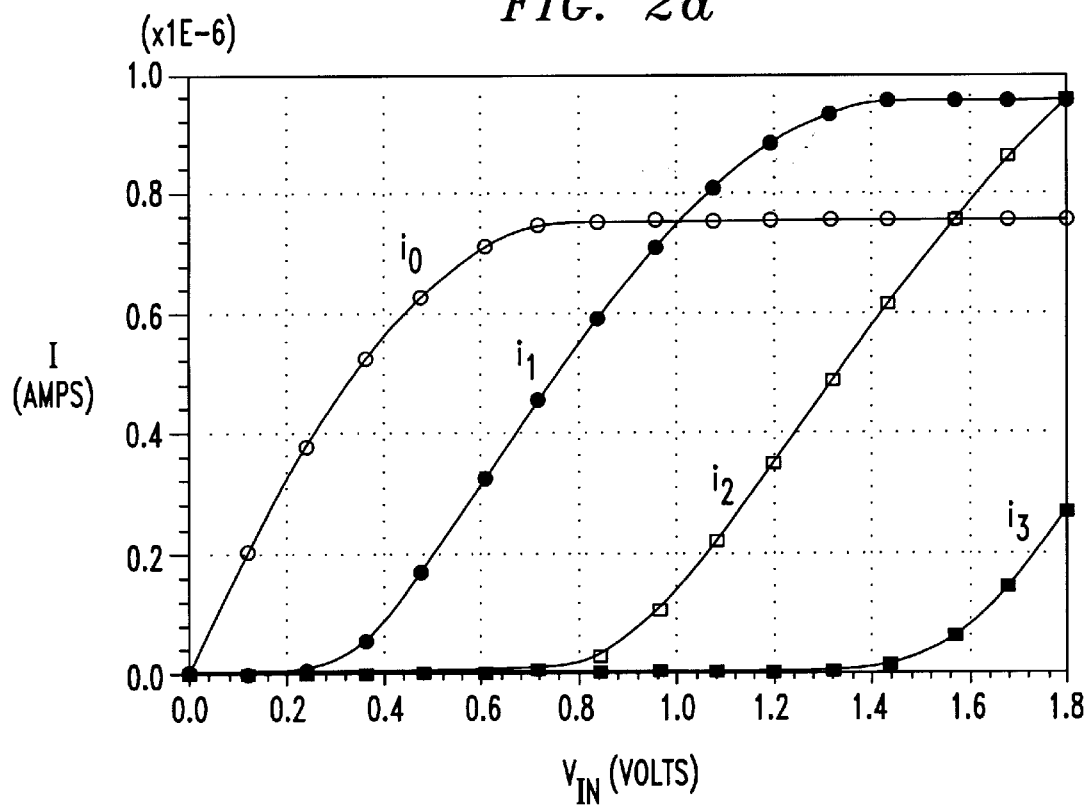
Figure 2E:
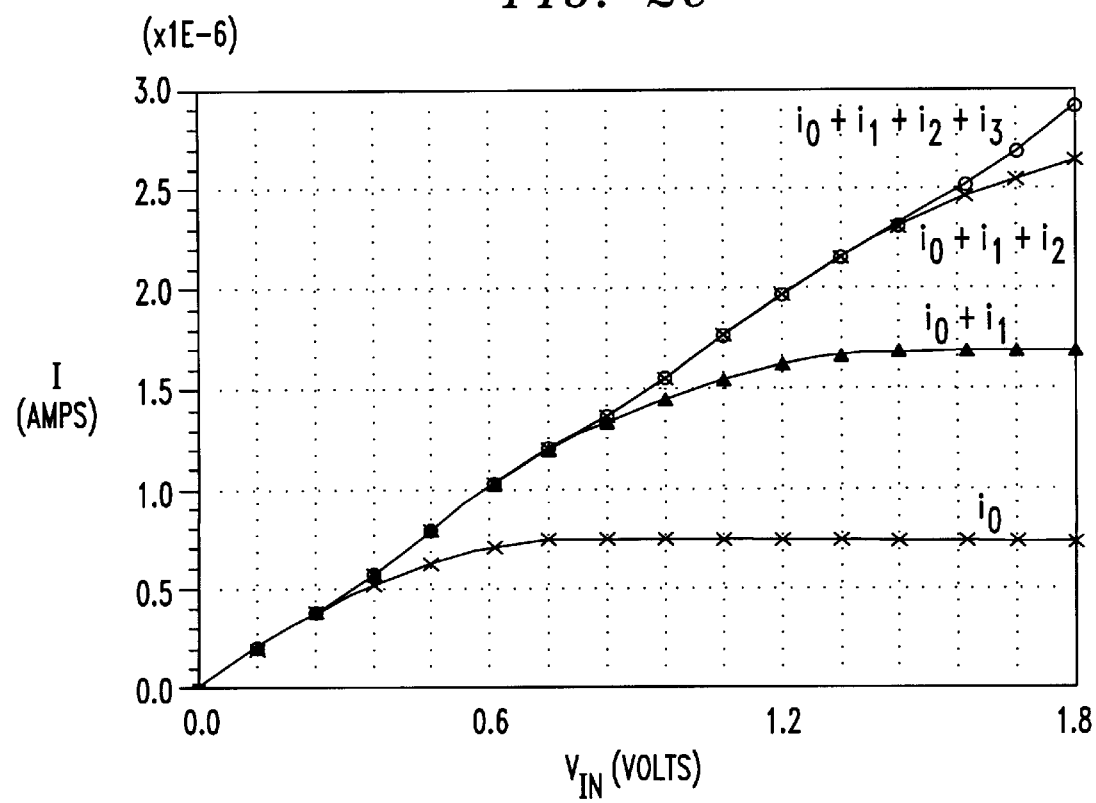

FIGS. 2d and 2e show the individual offsets and resulting cumulative transfer functions, respectively, for the transconductor stages 11 shown in FIG. 2a, in which the individual transconductor stage output currents and summations thereof are plotted against the input voltage $V_{IN}$.

The linear dynamic range of the transconductor circuit 10 is further improved if the differences between the threshold voltages of the transconductor stages 11 contributing to the output current are reduced. In an alternative embodiment, a transconductor circuit 54 is shown in FIG. 3a, which accomplishes the improvement of the linear dynamic range by providing parallel first and second sets of transconductor stages 11A, 11B, with the first set designated in FIG. 3a having the subscript nA, with n=0,1,2 . . . , and the second set designated in FIG. 3a having the subscript nB, with n=0,1,2, . . .

Figure 3A:
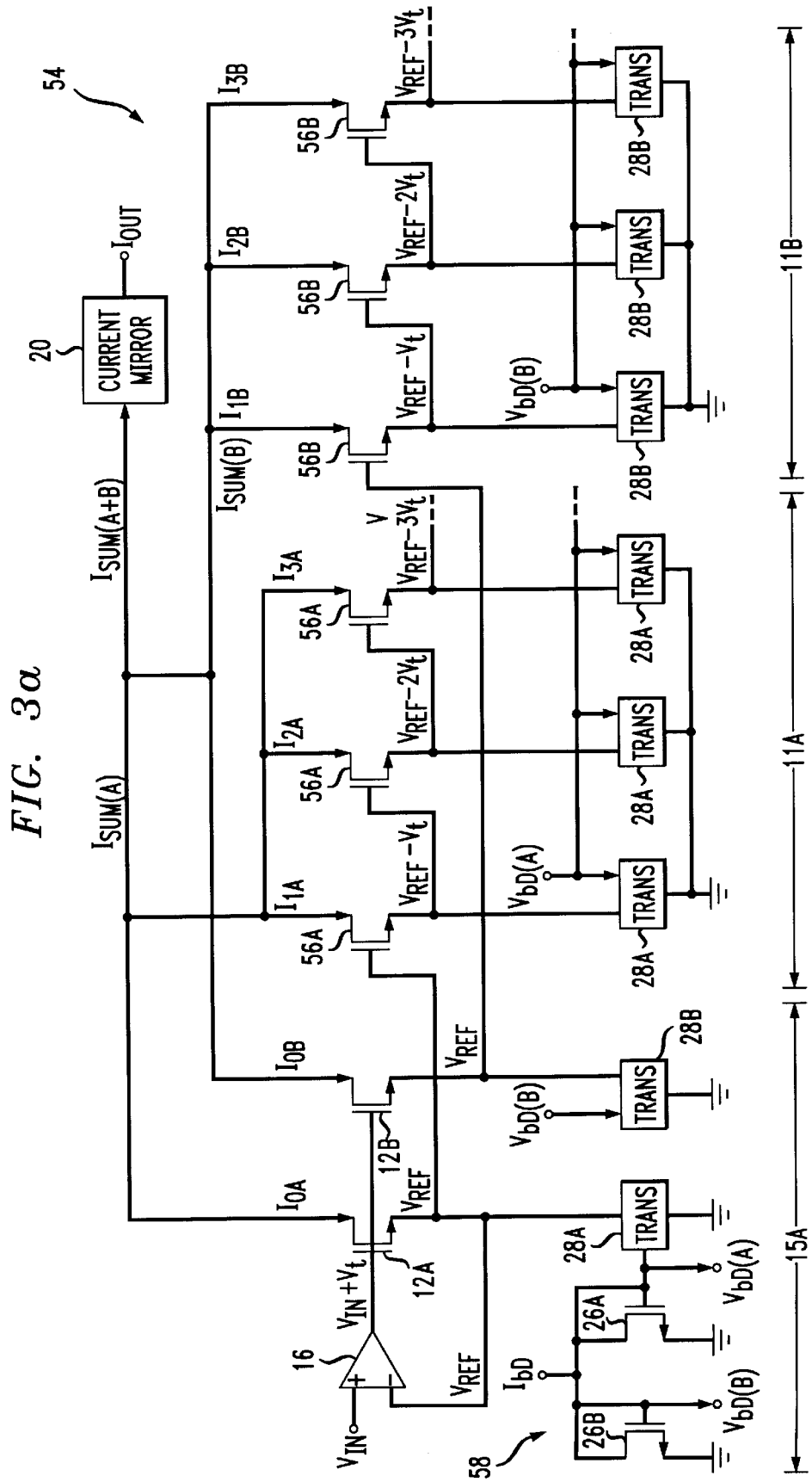
FIG. 3a shows a multistage single-ended transconductor circuit having parallel first and second sets of transconductor stages.

In FIG. 3a, the output current $I_{OUT}$ of the transconductor circuit 54 is the sum $I_{SUM(A+B)}$ of the output currents $I_{SUM(A)}$ and $I_{SUM(B)}$ of first and second parallel sets of transconductor stages 11A, 11B, respectively, in which the amplifier element 12A of the input amplifier stage 15A connected to the first set 11A has a short channel length so that W/L>>1, as in the transconductor stages 11 of FIG. 2a, and the amplifier element 12B of the input amplifier stage 15A connected to the second set 11B has a longer channel length so that W/L<1. The sum $I_{SUM(A+B)}$ may further be applied to a current mirror stage 20, such as described above, to generate the output current $I_{OUT}$. Thus, the second set 11B has a significantly higher "ON" voltage $V_{GS}$ for a given current load, so that the individual transfer curves of the two sets 11A, 11B of transconductor stages are "interleaved", as shown in FIG. 3b.

In each set 11A, 11B of transconductor stages, the transistors 56A, 56B are respectively connected to the previous transistors in the sets of transistors 12A, 12B, 56A, and 56B, and are connected to receive currents $I_{nA}$, $I_{nB}$, respectively, for n=1, 2, etc., from the transistors 12A, 12B, respectively. The transistors 12A, 12B, 56A, and 56B are also respectively connected to the transistor elements 28A, 28B, as shown in FIG. 3a. In addition, the pre-amplifier circuit 15A includes an operational amplifier 16 and transistor elements 26A, 26B of a bias circuit 58 connected to an input bias current $I_{bD}$ to generate respective bias voltages $V_{bD(A)}$ and $V_{bD(B)}$ which are applied to the transistor elements 28A, 28B, respectively, in the sets 11A, 11B of stages, respectively.

Figure 3B:
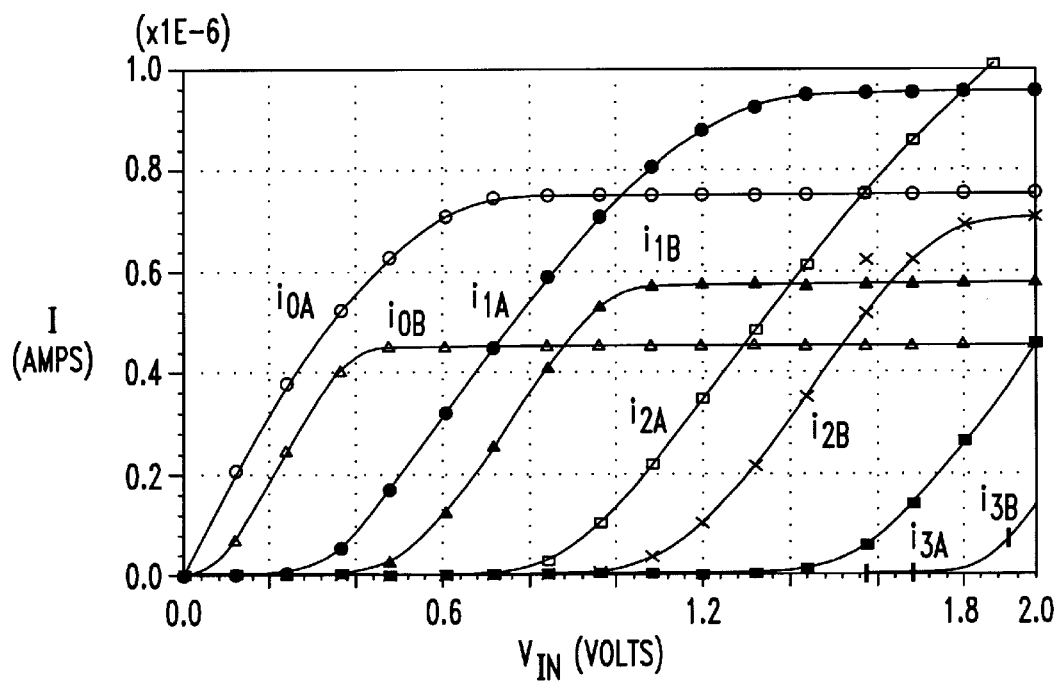
Figure 3C:
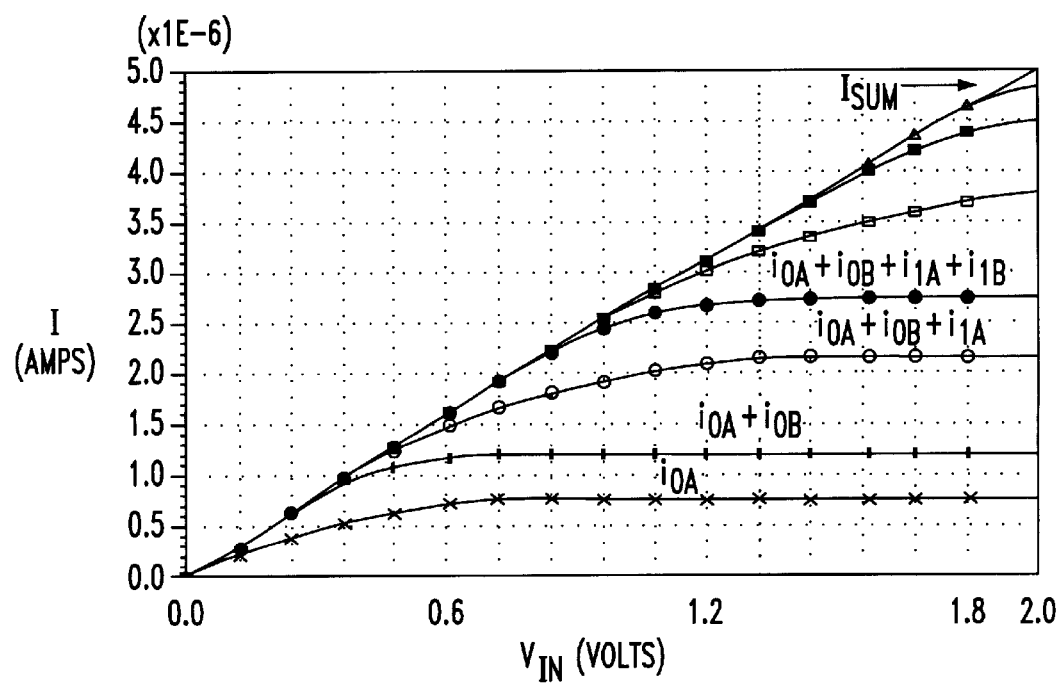

FIGS. 3b and 3c show the resulting individual and cumulative transfer functions, respectively, for the sets 11A, 11B of transconductor stages, shown in FIG. 3a, in which the stage output currents and summations thereof are plotted against the input voltage $V_{IN}$.

Figure 4A:
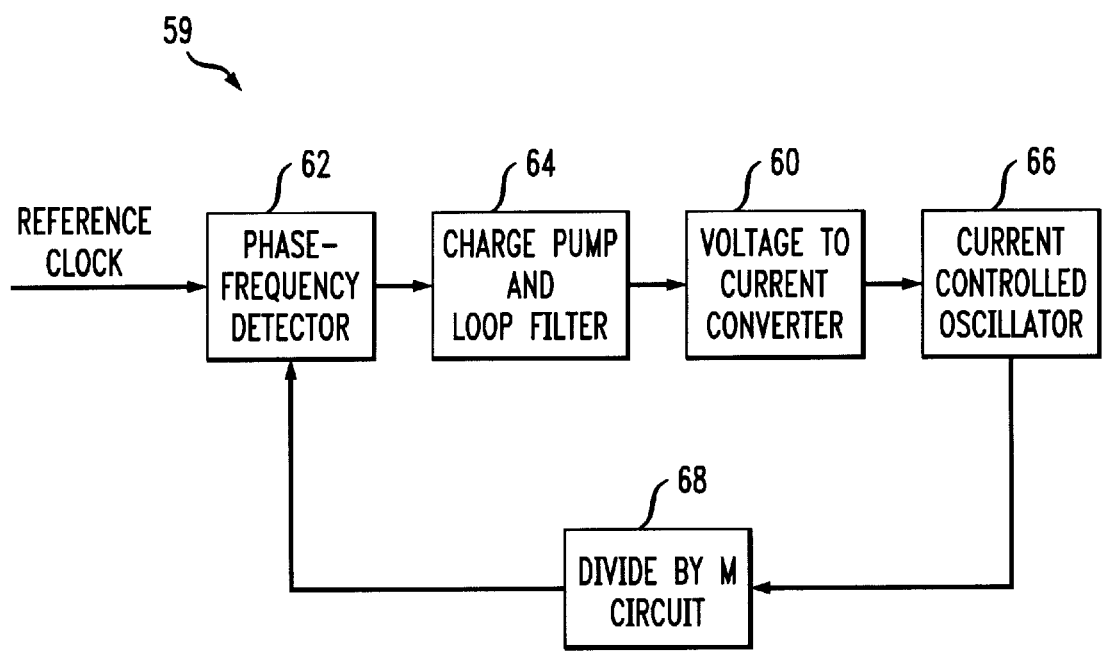
FIG. 4a is a schematic block diagram of a phase-locked loop using a non-linear transconductor circuit in accordance with the present invention.

Alternatively, the sizes of the input transistors in the sets 11A, 11B of transconductor stages can be selected so as to provide a non-linear transfer function for the transconductor circuit 54. For example, in a phase-locked loop (PLL), the loop gain $G_L$ is directly proportional to a divider ratio M if the transconductor at the input to the current-controlled oscillator (CCO) is a linear function:

$$G_L=f(M)=gM$$

in which g is a constant of proportionality. A loop-frequency-independent gain can be provided for the CCO if the current i input to the CCO is exponentially related to the control voltage V provided by the phase-locked loop:

$$i=i_0 e^{k(V-V_0)}$$

where $i_0$ and $V_0$ are constants representing offsets and k is a constant, with such values selected to suit the desired application. FIG. 4a is a schematic block diagram of a phase-locked loop circuit 59 using a non-linear transconductor circuit 10, 54 described above with reference to FIGS. 2a–3c in accordance with the present invention to provide such an exponential control current. The non-linear transconductor circuit is implemented in the voltage-to-current converter 60.

In an illustrative embodiment, the PLL circuit 59 includes a phase-frequency detector 62, a charge pump and loop filter 64, the voltage-to-current converter 60, and a CCO 66. In response to a reference clock signal, the PLL circuit 59 generates an output signal from the CCO 66 which is divided by the ratio M using a divider circuit 68. The divided signal is fed back to the phase-frequency detector 62.

Figure 4B:
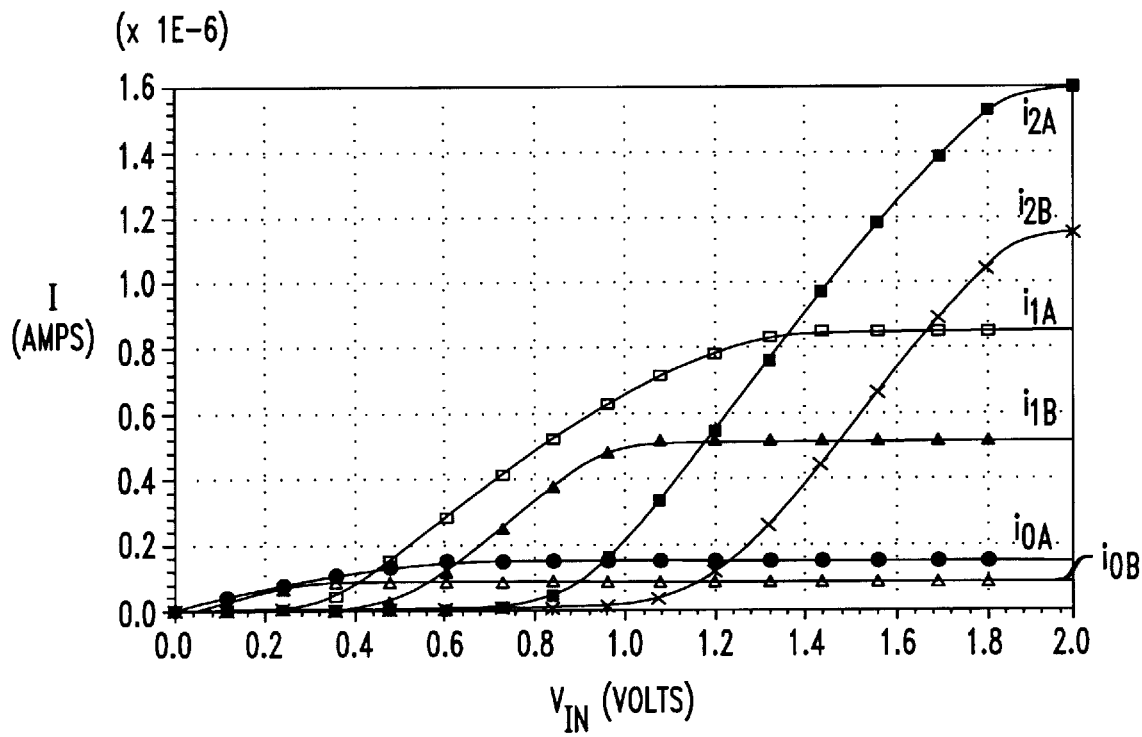
Figure 4C:
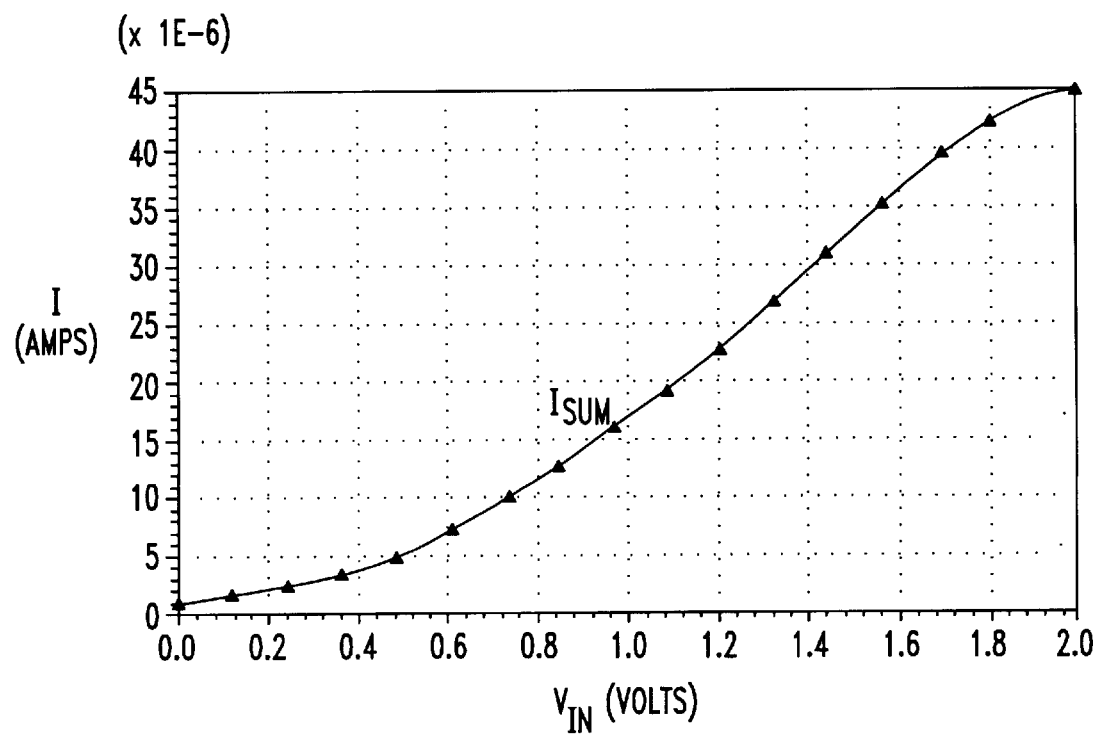

Referring, for example, to the embodiment shown in FIG. 3a, a selection is made for the widths of the channels under the gates of the transistors in each set of transistors in the parallel sets 11A, 11B of transconductor stages used in the voltage-to-current converter circuit 60 shown in FIG. 4a. Such widths are selected so that the actual control current supplied to the CCO 66 has a monotonic, substantially exponential transfer function. However, for the desired performance characteristics of the transconductor circuit 54, because a roll-off of the function is required at about 1.8 volts, fewer transconductor stages are used, but the parallel sets of stages smooth the transfer function, as shown in FIGS. 4b–4c. The individual non-linear transfer functions for the transconductor stages 11 used as the converter 60 in the PLL circuit 59 of FIG. 4a are shown in FIG. 4b, and the cumulative non-linear transfer function reflecting in the current $I_{SUM}$ generated by the PLL circuit 59 is shown in FIG. 4c.

However, the exponential transfer function is to be rolled-off somewhat at the upper end, as shown in FIG. 4c, to prevent excessively high-frequency operation during start-up. Excessively high-frequency outputs from the CCO 66 are prevented from over-driving the divider logic 68 which would lock up and disable the PLL circuit 59. Thus, a two stage transconductor circuit may be implemented, in which a third stage of the stages 11 shown in FIG. 2a is not provided in the voltage-to-current converter circuit 60 shown in FIG. 4a, so that $I_{SUM}$ rolls off with the $i_{2A}$ and $i_{2B}$ characteristic curves shown in FIG. 4b, providing a transconductance function that permits the PLL circuit 59 to operate at a lower supply voltage than was previously possible, without loss of stability.

Figure 4D:
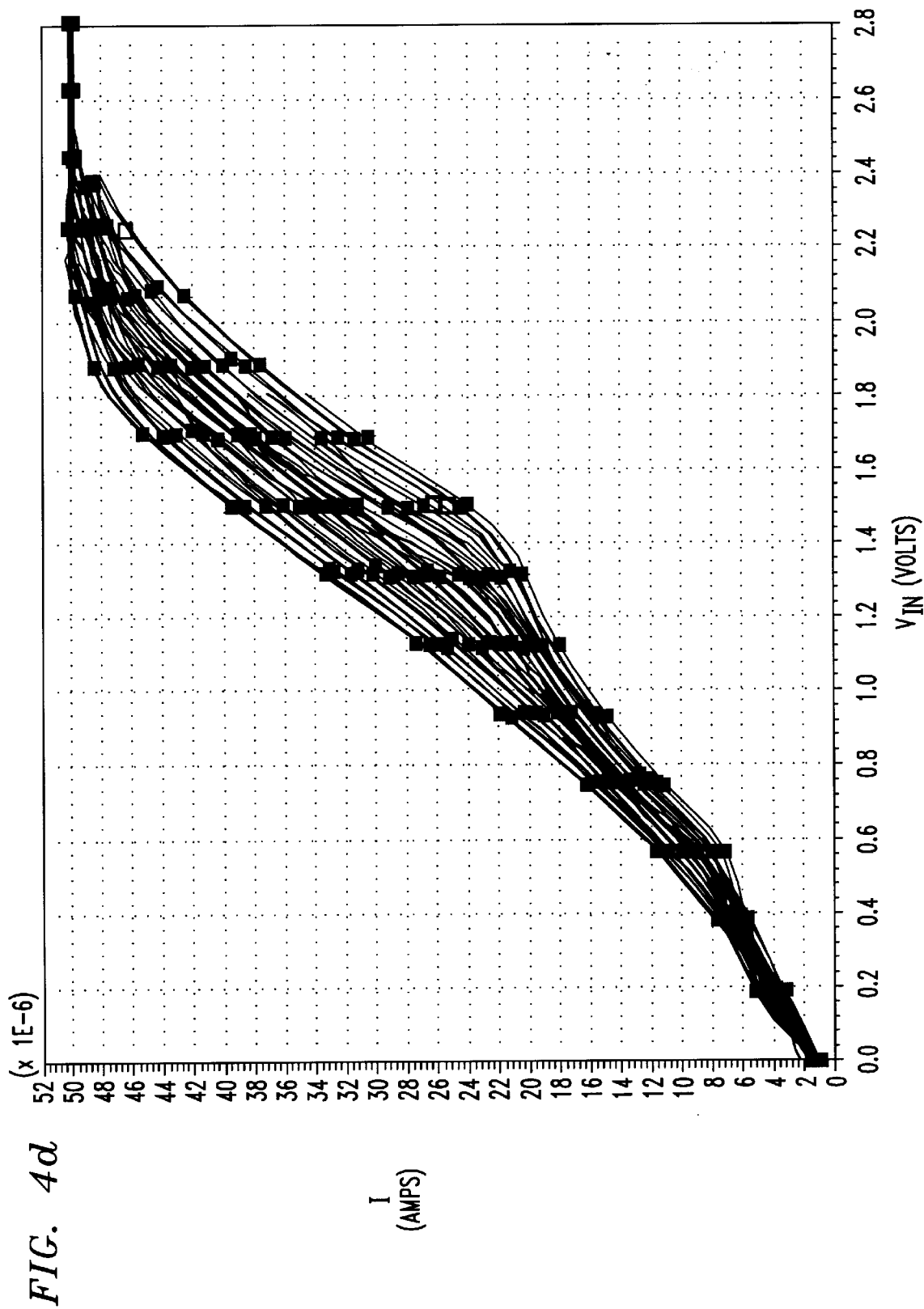
FIG. 4d shows the low level of process-variability in the transfer functions of FIG. 4c in multiple transconductor circuits over a wide range of operating conditions, including junction temperatures of −40° C. to +125° C., and supply voltages ranging from 1.8 volts to 3.6 volts.

In both linear and non-linear transfer function regimes, the transfer function of the transconductor circuits is robust to process variations across a wide range of operating conditions, as demonstrated by the tightly packed set of $I_{OUT}$ simulation curves shown in FIG. 4d, ranging from high-voltage, low-temperature operation on the high side to the opposite combination on the low side. Such low level variability may be sustained in standard simulation runs using junction temperatures of −40° C. and +125° C. and power supply voltages of 1.8, 2.4 and 3.6 volts, and allowing for the statistically predictable types of manufacturing variability in such devices.

The present invention has been described with particular reference to presently preferred embodiments thereof. However, it will be apparent to one skilled in the art that variations and modifications are possible within the spirit and scope of the invention, which is defined by the claims appended below. For example, a further set of stages may be added in parallel to the other two sets 11A, 11B of FIG. 3a, in special circumstances in which a need exists for very fine resolution in the smoothing of the transfer curve of the transconductor curve. Also additional elements may be added to each stage, and additional stages may be added to extend the linear range.

What is claimed is:

1. A transconductor circuit comprising:

a plurality of transconductor stages, each transconductor stage including:

an amplifier element for amplifying a respective stage input signal to generate a respective stage output signal of the transconductor stage;

an active load element connected to the respective amplifier element for generating the respective stage output signal with substantially linear resistance characteristics;

wherein a first transconductor stage receives a circuit input signal input to the transconductor circuit as the respective stage input signal thereof, and the first transconductor stage operates as a pre-amplifier to a successive transconductor stage; and a current output stage, responsive to the stage output signals, for generating an output current signal based upon a single voltage input to the transconductor circuit with rail-to-rail voltage compliance.

2. The transconductor circuit of claim 1 wherein the amplifier element of the first transconductor stage includes:

a transistor for generating the stage output signal; and an operational amplifier for amplifying the circuit input signal above an input signal threshold of the transistor, thereby eliminating an offset from the stage output signal.

3. The transconductor circuit of claim 1 wherein each of the active load elements of the plurality of transconductor stages includes a first transistor; and wherein a second transconductor stage has a respective active load element further including a second transistor for generating a bias signal applied to the first transistor of each of a plurality of the active load elements of the plurality of transconductor stages.

4. The transconductor circuits of claim 1, wherein each of the active load elements of the plurality of transconductor stages includes a first transistor; and wherein the first transconductor stage has a respective active load element further including a second transistor for generating a bias signal applied to the first transistor of each of the active load elements of the plurality of transconductor stages.

5. The transconductor circuit of claim 3, wherein the active load element of the second transconductor stage includes a current mirror circuit having the first and second transistors.

6. The transconductor circuit of claim 1, wherein the current output stage includes:

a level shifter, responsive to the stage output signals, for providing a desired headroom of the circuit output signal.

7. The transconductor circuit of claim 1, wherein the current output stage includes a current mirror.

8. The transconductor circuit of claim 1, wherein a sum of the stage output signals is provided to the output stage.

9. The transconductor circuit of claim 1, wherein the plurality of transconductor stages includes:

a first set of the transconductor stages; and a second set of the transconductor stages;

wherein each of the first and second sets of transconductor stages includes a respective first transconductor stage operating as a pre-amplifier to a successive transconductor stage in the respective set of transconductor stages.

10. The transconductor circuit of claim 1, wherein each of the plurality of transconductor stages provides a linear transfer function.

11. The transconductor circuit of claim 1, wherein each of the plurality of transconductor stages provides a non-linear transfer function.

12. The transconductor circuit of claim 11, wherein each of the plurality of transconductor stages provides an exponential transfer function.

13. An integrated circuit having a transconductor circuit providing rail-to-rail compliance performance comprising:

a plurality of transconductor stages, each transconductor stage including:

an amplifier element including an amplifying field effect transistor (FET) for amplifying a respective stage input signal to generate a respective stage output signal of the transconductor stage;

an active load element including a bias-input transistor for receiving a bias signal, and connected to the respective amplifier element for generating the respective stage output signal with substantially linear resistance characteristics;

wherein a first transconductor stage receives a circuit input signal input to the transconductor circuit as the respective stage input signal thereof, wherein the first transconductor stage operates as a pre-amplifier to a successive transconductor stage; and wherein a second transconductor stage includes current mirror transistors forming a current mirror with a respective bias-input transistor; and an output stage, responsive to the stage output signals, for generating an output current signal based upon a single voltage input to the transconductor circuit with rail-to-rail voltage compliance.

14. The integrated circuit of claim 13 wherein the amplifier element of the first transconductor stage includes:
an operational amplifier for amplifying the circuit input signal above an input signal threshold of the transistor, thereby eliminating an offset from the stage output signal.

15. The integrated circuit of claim 13, wherein the output stage includes:
a level shifter, responsive to the stage output signals, for providing a desired headroom of the circuit output signal.

16. The integrated circuit of claim 13, wherein the output stage includes a current mirror.

17. The integrated circuit of claim 13, wherein a sum of the stage output signals is provided to the output stage.

18. The integrated circuit of claim 13, wherein the plurality of transconductor stages includes:
a first set of the transconductor stages; and
a second set of the transconductor stages;
wherein each of the first and second sets of transconductor stages includes a respective first transconductor stage operating as a pre-amplifier to a successive transconductor stage in the respective set of transconductor stages; and
wherein the first and second sets of transconductor stages are arranged in parallel to reduce the effects of a set of threshold voltages from the plurality of transconductor stages, thereby improving a dynamic range of operation of the transconductor circuit.

19. The integrated circuit of claim 13, wherein each of the plurality of transconductor stages provides a linear transfer function.

20. The integrated circuit of claim 13, wherein each of the plurality of transconductor stages provides a non-linear transfer function.

21. The integrated circuit of claim 20, wherein each of the plurality of transconductor stages provides an exponential transfer function.

22. A method for providing rail-to-rail compliance in a transconductor circuit, the method comprising the steps of:
pre-amplifying a circuit input signal above an input signal threshold to eliminate an offset in the circuit input signal;
amplifying stage input signals generated from the circuit input signal in a plurality of transconductor stages;
generating a plurality of stage output signals from the plurality of transconductor stages;
providing substantially linear resistance characteristics associated with the generated stage output signals using active load elements in the plurality of transconductor stages;
adding the stage output signals; and
applying the summation of the stage output signals to a current mirror to generate a circuit output signal having the rail-to-rail compliance characteristics.

23. The method of claim 22, wherein the step of generating the stage output signals includes the steps of:
generating a transconductor stage bias signal from an input bias signal using at least one of the transconductor stages; and
applying the transconductor stage bias signal to each of the transconductor stages for respectively generating the stage output signals.

* * * * *